(12) United States Patent
Wang et al.

(10) Patent No.: US 11,721,246 B2
(45) Date of Patent: *Aug. 8, 2023

(54) DISPLAY DEVICE

(71) Applicant: BOE TECHNOLOGY GROUP CO., LTD., Beijing (CN)

(72) Inventors: Haoran Wang, Beijing (CN); Dejun Bu, Beijing (CN); Paoming Tsai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 30 days.

This patent is subject to a terminal disclaimer.

(21) Appl. No.: 17/500,565

(22) Filed: Oct. 13, 2021

(65) Prior Publication Data

US 2022/0036774 A1   Feb. 3, 2022

Related U.S. Application Data

(63) Continuation of application No. 16/606,150, filed as application No. PCT/CN2019/077410 on Mar. 8, 2019, now Pat. No. 11,176,851.

(30) Foreign Application Priority Data

May 28, 2018   (CN) .......................... 201820799628.6

(51) Int. Cl.
*G09F 9/30* (2006.01)
*H10K 50/842* (2023.01)
*H10K 77/10* (2023.01)
*H10K 102/00* (2023.01)

(52) U.S. Cl.
CPC ......... *G09F 9/301* (2013.01); *H10K 50/8426* (2023.02); *H10K 77/111* (2023.02); *H10K 2102/311* (2023.02)

(58) Field of Classification Search
CPC ........................... G09F 9/301; H01L 51/0097
See application file for complete search history.

(56) References Cited

U.S. PATENT DOCUMENTS

| 11,176,851 B2* | 11/2021 | Wang .................. H01L 51/0097 |
| 2007/0216834 A1 | 9/2007 | Hsu et al. |
| 2019/0229282 A1 | 7/2019 | Zhang et al. |

FOREIGN PATENT DOCUMENTS

| CN | 107104200 A | 8/2017 |
| CN | 207008995 U | 2/2018 |
| CN | 107968109 A | 4/2018 |
| CN | 208141720 U | 11/2018 |

OTHER PUBLICATIONS

International Search Report and Written Opinion of the International Searching Authority, with English translation, issued in International application No. PCT/CN2019/077410, dated May 29, 2019, (16 pages).
Non-Final Office Action issued in corresponding U.S. Appl. No. 16/606,150 dated Mar. 24, 2021 (10 pages).

* cited by examiner

*Primary Examiner* — Anthony Ho
(74) *Attorney, Agent, or Firm* — Muncy, Geissler, Olds & Lowe, P.C.

(57) ABSTRACT

The present disclosure relates a display device, including a flexible display panel with a bendable region and a flexible support attached to a back side of the flexible display panel, the flexible support includes a flexible support body, and a first part of the flexible support body corresponding to the bendable region is provided with a concave structure.

18 Claims, 5 Drawing Sheets

DISPLAY DEVICE

CROSS-REFERENCE TO RELATED APPLICATION

This application is a continuation application of U.S. patent application Ser. No. 16/606,150 filed on Oct. 17, 2019, which is the U.S. national phase of PCT Application No. PCT/CN2019/077410 filed on Mar. 8, 2019, and claims priority to Chinese Patent Application No. 201820799628.6 filed on May 28, 2018, the disclosures of which are incorporated in their entirety by reference herein.

TECHNICAL FIELD

The present disclosure relates to a field of a display device manufacturing technology, and in particular to a display device.

BACKGROUND

A development trend of intelligent, portable and flexible is one of the main development directions of current electronic devices. A new display device represented by an Organic Light-Emitting Diode (OLED) display device has attracted more and more attention and recognition because of its lightness, gorgeous, energy-saving, especially the outstanding characteristic of flexibility.

Comparing to a conventional flat panel display, the most outstanding advantage of a flexible display is that the flexible display breaks through an traditional concept of two-dimensional display and expands the application field of the display into more aspects of living scenario and portable devices. Foldable display, as a development direction of a new generation of a flexible display technology, has received extensive attention in the industry. The main problems and difficulties are: the flexible display device is relatively light and thin, and the bending resistance and impact resistance are poor; a large local deformation caused by bending for a long time may lead to denaturation of polymer materials in the display, an occurrence of "creases" and "white lines" etc. in a bendable region, resulting in failure of the display.

SUMMARY

The present disclosure provides a display device, including a flexible display panel with a bendable region and a flexible support attached to a back side of the flexible display panel, wherein the flexible support includes a flexible support body, a first part of the flexible support body corresponding to the bendable region is provided with a concave structure, and a second part corresponding to an unbendable region of the flexible display panel, wherein a sum of an area of the first part and an area of the second part is larger than an area of the flexible display panel.

Furthermore, a depth of the concave structure is less than a thickness of the flexible support body.

Furthermore, the concave structure includes a strip groove, and a length extension direction of the strip groove is parallel to a bending axis of the bendable region.

Furthermore, an opening area of the strip groove is larger than a bottom area of the strip groove.

Furthermore, a cross section of the strip groove perpendicular to the length extension direction is V-shape, trapezoidal or V-shape.

Furthermore, the strip groove is at least partially filled with a buffer material.

Furthermore, a depth of the concave structure is equal to a thickness of the flexible support body.

Furthermore, the concave structure includes a strip groove, a length extension direction of the strip groove is perpendicular to a bending axis of the bendable region.

Furthermore, the concave structure includes a through hole penetrating the flexible support body in a thickness direction.

Furthermore, a cross section of the through hole along a direction perpendicular to the thickness direction is rectangular, rhombic or hexagonal.

Furthermore, the flexible support body is a metal film layer.

Furthermore, the flexible support body further comprises an adhesive layer, the flexible support body is attached to the flexible display panel through the adhesive layer.

Furthermore, the adhesive layer is a pressure sensitive adhesive layer.

Furthermore, a thickness of the flexible support is 15 um-500 um.

Furthermore, the thickness of the flexible support is 50 um-250 um.

Furthermore, the thickness of the flexible support body is 15 um-150 um.

Furthermore, the thickness of the flexible support body is 30 um-50 um.

Furthermore, the display device is a foldable display device.

DETAILED DESCRIPTION

Figure 1:
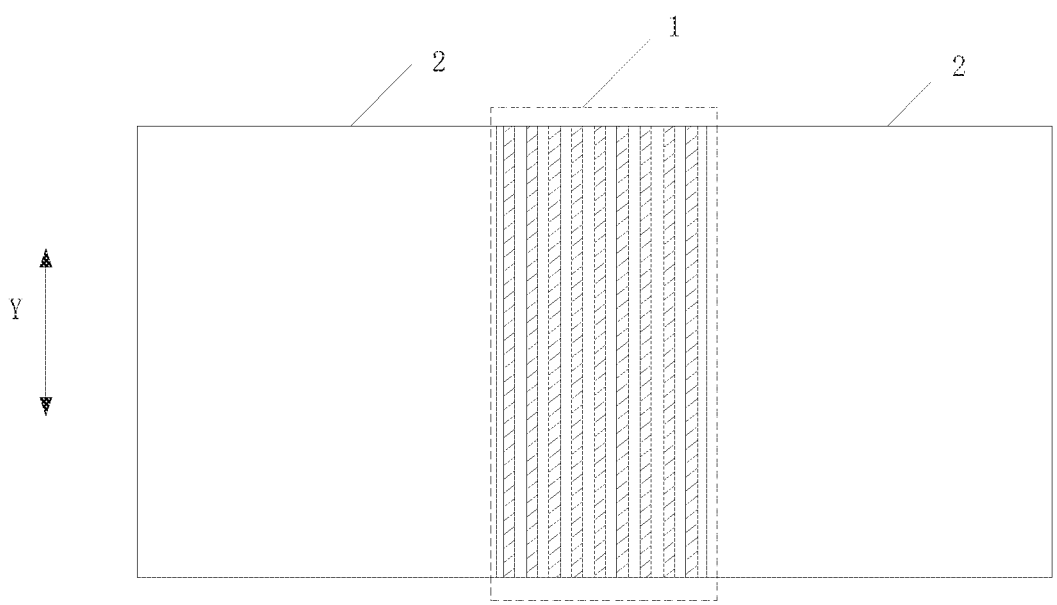
FIG. 1 is a schematic diagram illustrating a structure of a flexible support according to some embodiments of the present disclosure.

Features and principles of the present disclosure will be described in detail hereinafter with reference to the accompanying drawings, and the embodiments cited are used only to explain the present disclosure, rather than to limit the scope of protection of the present disclosure.

As shown in FIG. 1-FIG. 13, some embodiments of the present disclosure provide a display device, the display device includes a flexible support, the flexible support is attached to a back side of a flexible display panel with a bendable region, the flexible support includes a flexible support body, and a first part 1 of the flexible support body corresponding to the bendable region is provided with a concave structure.

The flexible support may be attached to the back side of the flexible display panel, that is, on another surface opposite to a surface for image display, which enhances impact resistance and bending resistance of the flexible display panel. In some embodiments, the flexible support includes a flexible support body. Optionally, the flexible support may also include a film structure for attaching the flexible support body to a display substrate. According to some embodiments of the present disclosure, the first part 1 of the flexible support body is corresponding to the bendable region of the flexible display panel, and a concave structure is arranged on the first part 1, so that a bending stress produced by the flexible display panel during bending may be distributed along a thickness variation boundary of every concave structure, rather than concentrated near a bending axis. The concave structure may disperse stress, avoid a large local deformation caused by bending of long time due to a stress concentration, which may lead to a denaturation of polymer materials in the display, and avoid an occurrence of "creases" and "white lines" etc. in the bendable region. The "bending axis" described above represents an axis around which the flexible display panel is bent. In some embodiments of the present disclosure, the bending axis extends along a Y axis shown in FIG. 1.

Specific structural forms of the concave structure may be varied, provided that an effect of dispersing stress is realized. In some embodiments of the present disclosure, the first part 1 includes a first surface deviating from the flexible display panel and a second surface opposite to the first surface, the second surface is to be attached with the flexible display panel.

According to some embodiments of the present disclosure, the concave structure may include a plurality of grooves or through holes recessed in a direction from the first surface to the second surface. In other words, a depth of the concave structure may be set to be less than a thickness of the flexible support body. And the concave structure may be opened on the first surface without penetrating the flexible support body in a thickness direction. In other embodiments, a depth of the concave structure may be set to be equal to a thickness of the flexible support body, that is, a through-hole structure is formed through the flexible support body in the thickness direction.

When the flexible support is connected to the flexible display panel, the second surface is connected to the back side of the flexible display panel (a surface opposite to a display surface). In some embodiments, for example, when a separate flexible support is attached to a flexible display panel, the second surface may be provided with a adhesive layer, that is, the flexible support body is attached to the flexible display panel through the adhesive layer. In other embodiments, the flexible support may also be pre-attached to the flexible display panel by other processes before the flexible display panel is manufactured.

When the concave structure includes a plurality of the grooves, shapes and distributions of the grooves may be varied. In some embodiments of the present disclosure, the plurality of grooves is a plurality of strip grooves arranged side by side.

Figure 2:
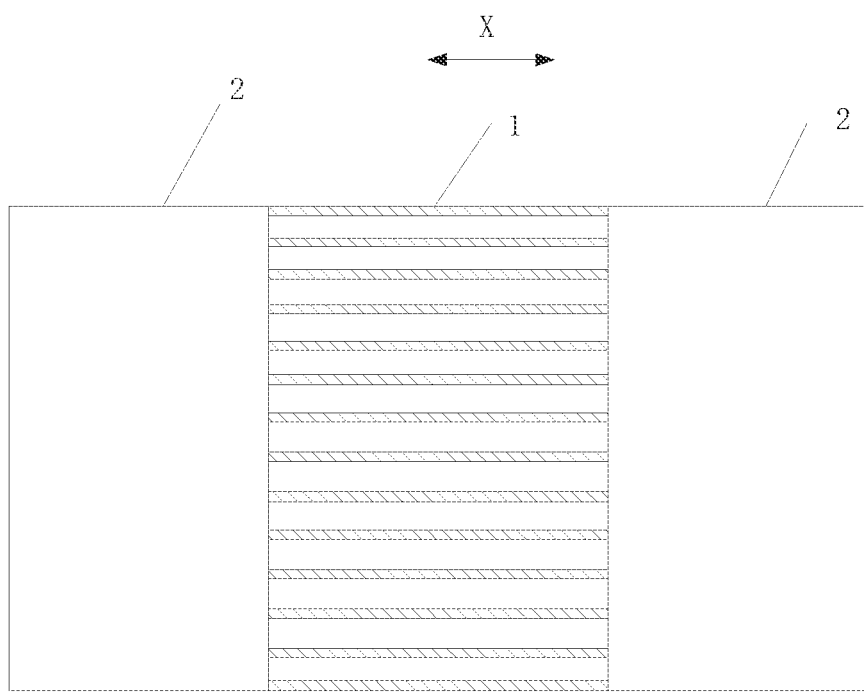
FIG. 2 is a schematic diagram illustrating a structure of a flexible support according to some embodiments of the present disclosure.

In some embodiments, the first part is a rectangular structure. Each of the plurality of strip grooves extends along a width or length direction of the first part 1. FIG. 1 shows a schematic diagram of a structure of each of the plurality of strip grooves extends along a width direction of the first part 1 (Y direction in FIG. 1); and FIG. 2 shows a schematic diagram of a structure of each of the plurality of strip grooves extends along a length direction of the first part 1 (X direction in FIG. 2).

As shown in FIG. 1, the flexible display panel may be bent along the bending axis, wherein an extension direction of the bending axis is parallel to a Y direction in FIG. 1. In some embodiments, the strip grooves may be set to extend along the Y direction, i.e., an extension direction of each strip groove is parallel to the bending axis of the flexible display panel. Generally speaking, the concave structure shown in FIG. 1 is suitable for a flexible support body with a large thickness. The flexible support body in the flexible support is to provide the display substrate with enhanced impact resistance and bending resistance. In other words, the flexible support body itself is not easy to be bent and has a high strength. In view of this situation, a plurality of strip grooves parallel to the direction of the bending axis are arranged on the flexible support body, which makes the first part 1 of the flexible support body has a good strength and a good bending performance at the same time.

Figure 8:
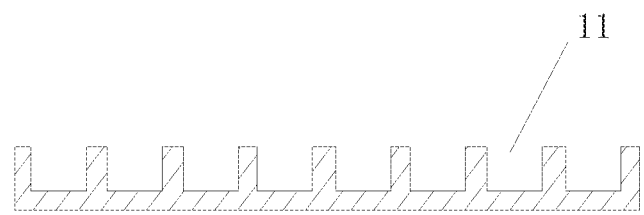
FIG. 8 is a schematic diagram illustrating a bendable region section according to some embodiments of the present disclosure.
Figure 9:
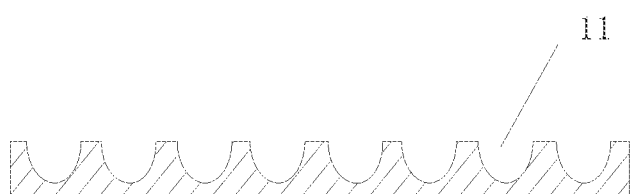
FIG. 9 is a schematic diagram illustrating a bendable region section according to some embodiments of the present disclosure.
Figure 10:
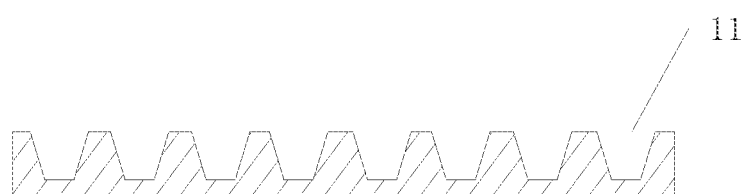
FIG. 10 is a schematic diagram illustrating a bendable region section according to some embodiments of the present disclosure.

In some embodiments of the present disclosure, a cross section of each of the plurality of strip grooves 11 perpendicular to a length extension direction is V-shape, trapezoidal or U-shape, as shown in FIG. 8-FIG. 10.

When the cross section of each of the plurality of strip grooves 11 is trapezoidal, an opening area of each of the plurality of strip grooves 11 is larger than a bottom area of each of the plurality of strip grooves 11, as shown in FIG. 10. Similarly, for a V-shaped or U-shaped strip groove, an opening area is larger than a bottom area. When the cross section of the strip groove is rectangular, an opening area is equal to a bottom area.

In some embodiments of the present disclosure, each of the plurality of strip grooves 11 is at least partially filled with a buffer material 3. The buffer material 3 plays a role in buffer and partial rebound. When flexible support is applied to the flexible display panel, impact resistance of flexible display panel is improved, and the flexible display panel may be restored from bending state to plane state more easily.

Specific arrangement positions and shapes of the buffer material 3 may be varied. In some embodiments of the present disclosure, each of the plurality of strip grooves 11 includes a first side wall and a second sidewall, and the buffer material 3 may be arranged on the first side wall or the second side wall. There is a gap between the buffer material 3 and the second side wall or the first side wall.

Figure 11:
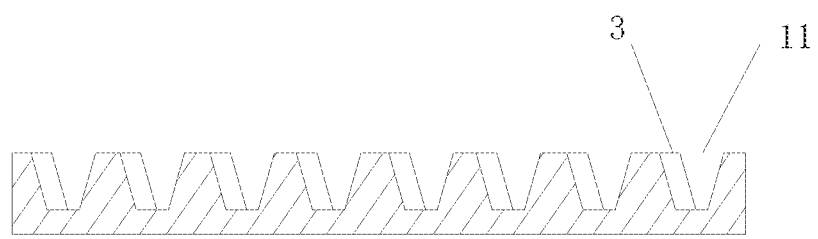
FIG. 11 is a schematic diagram illustrating a bendable region section according to some embodiments of the present disclosure.
Figure 12:
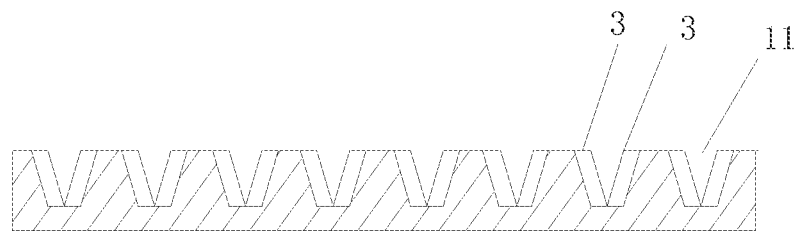
FIG. 12 is a schematic diagram illustrating a bendable region section according to some embodiments of the present disclosure.
Figure 13:
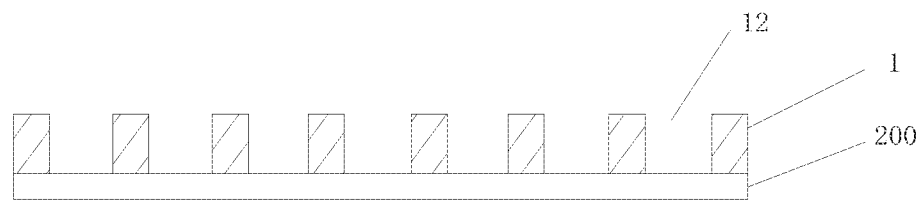
FIG. 13 is a schematic diagram illustrating a bendable region section according to some embodiments of the present disclosure.

Or, the first side wall and the second side wall are both provided with the buffer material 3, and there is a gap between the buffer material 3 arranged on the first side wall and the buffer material 3 arranged on the second side wall, as shown in FIG. 11 and FIG. 12. FIG. 11 and FIG. 12 are schematic diagrams illustrating a structure of the buffer material 3 arranged in a groove 11 with a trapezoidal cross section. But specific arrangement positions and shapes of the buffer material 3 are not limited to the above.

In some embodiments of the present disclosure, the buffer material 3 may be an elastic material or a foamed porous material, but is not limited to the above.

Figure 3:
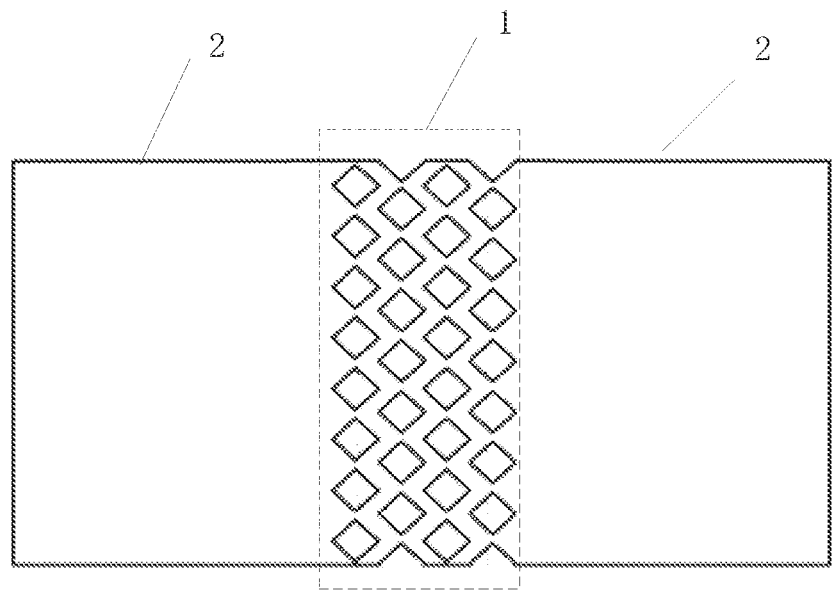
FIG. 3 is a schematic diagram illustrating a structure of a flexible support according to some embodiments of the present disclosure.
Figure 4:
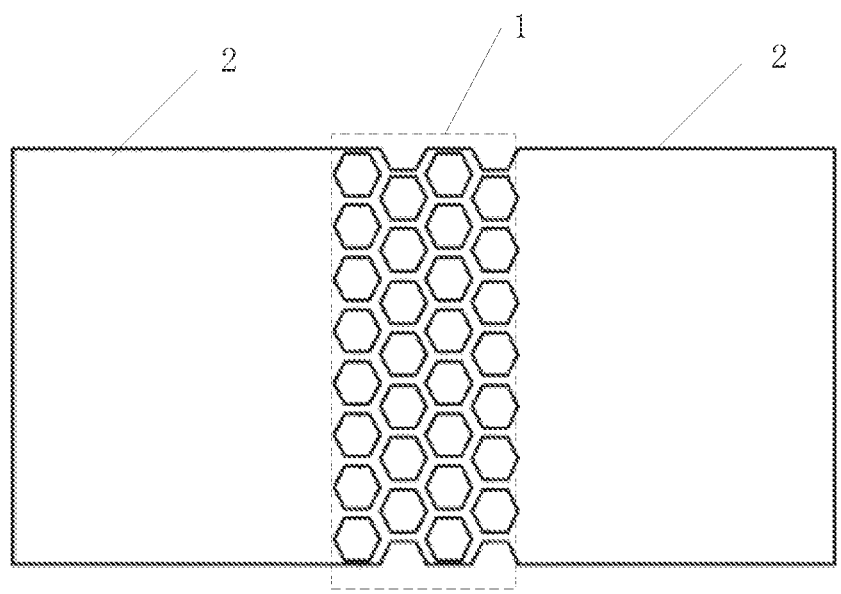
FIG. 4 is a schematic diagram illustrating a structure of a flexible support according to some embodiments of the present disclosure.
Figure 5:
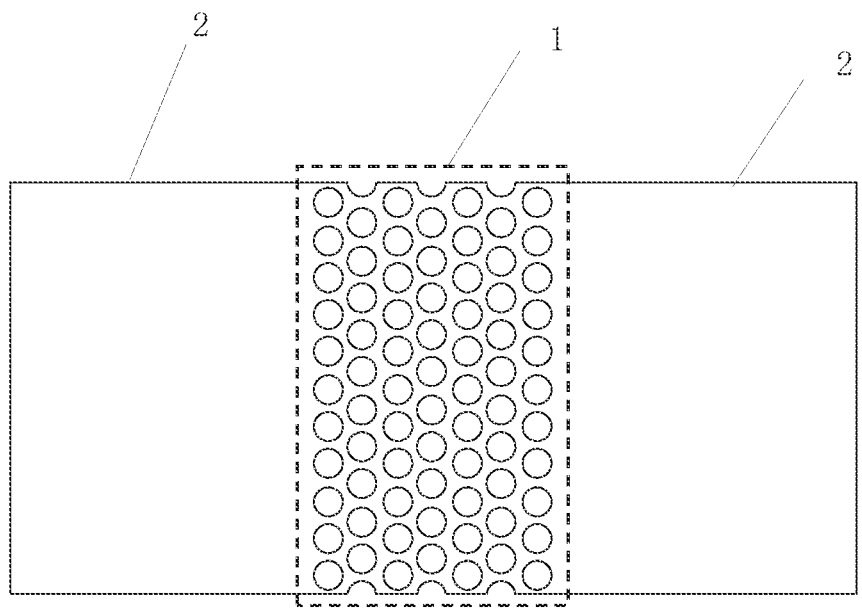
FIG. 5 is a schematic diagram illustrating a structure of a flexible support according to some embodiments of the present disclosure.
Figure 6:
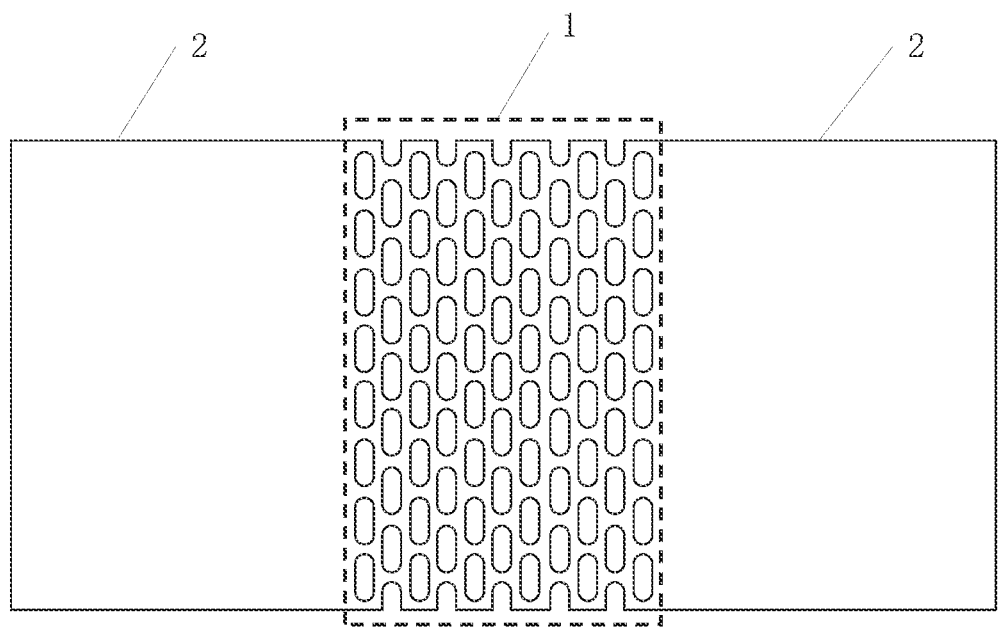
FIG. 6 is a schematic diagram illustrating a structure of a flexible support according to some embodiments of the present disclosure.

In some embodiments of the present disclosure, when the concave structure includes a plurality of through holes 12, a shape of the through holes 12 may be regular or irregular, such as strip, rhombus, hexagon, circular and round end and square hole, but not limited to the above. FIG. 3 is a schematic diagram illustrating a structure of a flexible support with a rhombus through hole 12. FIG. 4 is a schematic diagram illustrating a structure of a flexible support with a hexagon through hole 12. FIG. 5 is a schematic diagram illustrating a structure of a flexible support with a circular through hole 12. FIG. 6 is a schematic diagram illustrating a structure of a flexible support with a through hole 12 with a shape of round end and square hole.

In some embodiments, the through holes 12 are evenly distributed on the first part 1.

The quantity and size of the through hole 12 may be determined according to actual needs.

According to some embodiments of the present disclosure, a structure of through-hole distributed continuously may be arranged and a length direction of the structure extends along a direction perpendicular to the direction of the bending axis of the flexible display panel, i.e., along the X-axis direction as shown in FIG. 2. As shown in FIG. 2, a plurality of strip concave structures is arranged on the first part 1 of the flexible support body, each strip concave structure runs through the flexible support body in a direction perpendicular to the thickness direction of the flexible display panel. Therefore, these strip concave structures may also be called "through holes", and their length extension directions (or a direction of maximum size) are parallel to the flexible display panels. Generally speaking, the embodiment shown in FIG. 2 is suitable for a flexible support body with a small thickness. When the thickness of the flexible support body is small, the flexible support has a good bending performance, but can not provide enough structural strength to avoid a bending stress concentrating in a local bendable region. In order to avoid the stress concentration, a strip concave structure (strip through holes distributed continuously) extending along a direction perpendicular to the direction of the bending axis may be arranged. The strip concave structure makes the bending stress distribute along a thickness variation boundary of every strip through hole, so that the stress in the bending area may be dispersed effectively.

In some embodiments of the present disclosure, the flexible support also includes a second part 2 at least connected partially to an unbendable region of the flexible display panel.

Figure 14:
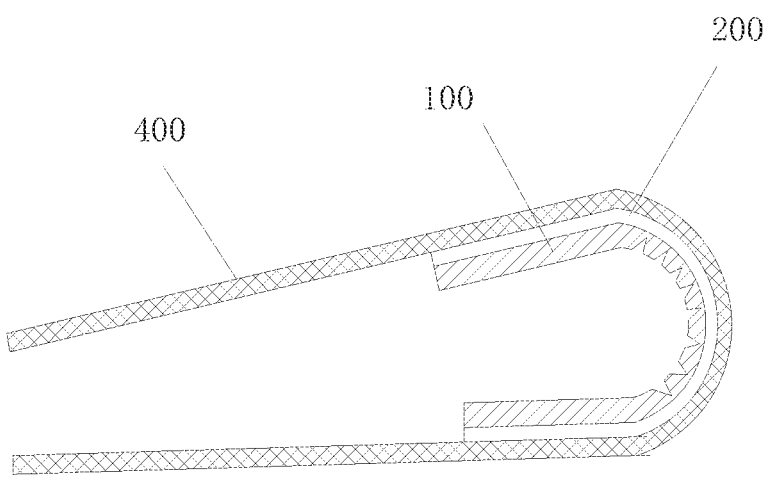
FIG. 14 is a schematic diagram illustrating an assembling state of a flexible support and a flexible display panel according to some embodiments of the present disclosure.

FIG. 14 is a schematic diagram illustrating a state in which a first part 1 of a flexible support is attached to a bendable region of a flexible substrate, and a second part 2 of a flexible support is attached to an unbendable region of a flexible display panel 400.

Figure 15:
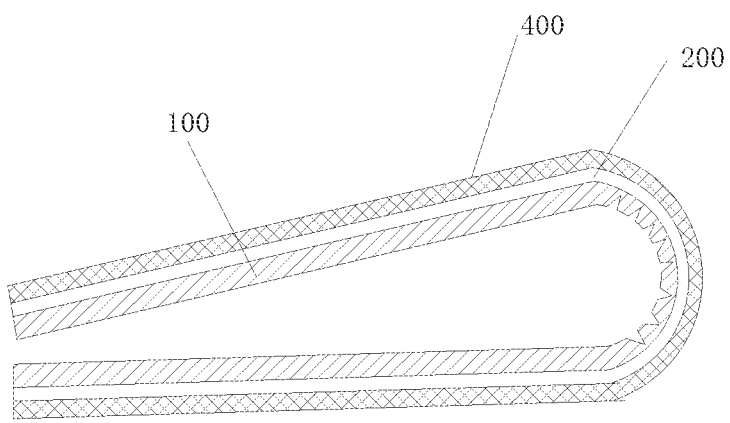
FIG. 15 is a schematic diagram illustrating an assembling state of a flexible support and a flexible display panel according to some embodiments of the present disclosure.

FIG. 15 is a schematic diagram illustrating a state in which a first part 1 of a flexible support is attached to a bendable region of a flexible substrate, and a second part 2 of a flexible support is attached to an unbendable region of a flexible display panel 400.

The second part 2 enhances impact resistance of the unbendable region of the flexible display panel 400, and a size of the second part 2 may be adjusted according to actual needs.

In some embodiments of the present disclosure, in order to satisfy the assembling requirements (requirements of assembling the flexible display panel 400 and a display device shell, wherein a flexible support and the shell shall be matched so as to fix a display substrate), a sum of an area of the first part 1 and an area of the second part 2 may be larger than an area of the flexible display panel 400. Of course, in other scenarios, the sum of the area of the first part 1 and the area of the second part 2 may be set equal to or less than the area of flexible display panel 400.

In some embodiments of the present disclosure, the flexible support body 100 is a metal film layer, which plays a role in enhancing the strength of the flexible display panel 400.

It should be noted that, the flexible support body 100 may be made of other materials, but other materials need to have a certain flexibility and strength, may be used for supporting, and may enhance impact resistance and bending resistance of the flexible display panel.

The first part 1 of the flexible support body 100 is to strengthen the protection and disperse stress of the bendable region of the flexible display panel 400, so various grooves or through holes are arranged on the first part 1; while the second part 2 of the flexible support body 100 is only to enhance the strength of the flexible display panel 400, so there is no need to set any concave structure on the second part 2.

Figure 7:
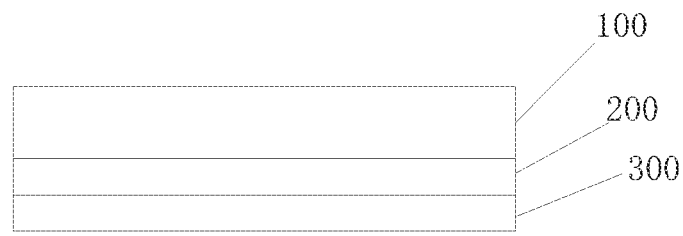
FIG. 7 is a schematic diagram illustrating a structure of a flexible support according to some embodiments of the present disclosure.

As shown in FIG. 7, in some embodiments of the present disclosure, the flexible support includes a flexible support body 100, the flexible support body 100 includes a third surface and a fourth surface arranged on an opposite side of the third surface, and the fourth surface of the flexible support body 100 is provided with a adhesive layer 200 and a detached film layer 300 successively.

It should be noted that, the third surface and fourth surface of the flexible support body 100 are one surface of the whole flexible support body 100 respectively. The first surface and the second surface are one surface of the first part 1 respectively. The flexible support body 100 includes the first part 1. Therefore, the third surface and the first surface are at a same plane, the fourth surface and the second surface of the first part 1 are at a same plane, and in an embodiment in which the flexible support body 100 includes the first part 1 only, the third surface and the first surface are the same structure, and the fourth surface and the second surface are the same structure. In an embodiment in which the flexible support body 100 includes the first part 1 and the second part 2, the range of the third surface is larger than that of the first surface, and the range of the fourth surface is larger than that of the second surface.

In some embodiments of the present disclosure, the adhesive layer 200 is a pressure sensitive adhesive (PSA) layer, and PSA is highly sensitive to pressure, which helps to avoid an occurrence of degumming, and ensures the stability of the connection between the flexible support body 100 and the flexible display panel 400.

When the flexible support is applied to the flexible display panel 400, the detached film layer 300 is removed, and then the flexible support is overlaid on the flexible display panel 400 through the adhesive layer 200. FIG. 14 and FIG. 15 are schematic diagrams illustrating the flexible support body 100 which is attached to the flexible display panel 400 through the adhesive layer 200. The flexible support body 100 is attached to the flexible display panel 400 through adhering, and the flexible support body 100 is fully adhered to the flexible display panel 400, which effectively ensures impact resistance and bending resistance of the flexible display panel 400.

The above embodiment in which the adhesive layer 200 and the detached film layer 300 are provided is suitable for the case where a user attaches the flexible support to the flexible display panel separately. In other embodiments, for example, a flexible support may be pre-attached to a flexible display panel by any suitable process before the flexible display panel is manufactured, and there may also be no adhesive layer 200 and detached film layer 300 arranged on the flexible support.

An overall thickness of the flexible support and a thickness of the flexible support body 100 may be set according to actual needs. In some embodiments of the present disclosure, the overall thickness of the flexible support is 15 um-150 um, and the thickness of the flexible support body 100 is 15 um-150 um. Furthermore, the thickness of flexible support may be 50 um-250 um. The thickness of flexible support body may be 30-50 um.

According to some embodiments of the present disclosure, the flexible display panel in the display device includes a body, the body includes a bendable region and an unbendable region and a back side of the body is provided with the flexible support. The unbendable region may be located on either or both sides of the bendable region.

The flexible support includes a flexible support body, the flexible support body includes at least a first part. The first part is attached to the bendable region correspondingly, and enhances impact resistance and bending resistance of the flexible display panel, especially provides supporting for the bendable region, so as to avoid an occurrence of "creases" and "white lines" etc. due to a concentration of bending stress.

The first part includes a first surface and a second surface arranged on an opposite side of the first surface, and a plurality of grooves or through holes recessed in a direction from the first surface to the second surface. The second surface is attached to the back side of the flexible display panel (a surface opposite to a display surface).

In some embodiments of the present disclosure, the flexible display panel is an OLED flexible display panel, and the flexible support is arranged on the back side (non-light-emitting surface) of the flexible display panel, but is not limited to the above.

What is described in the foregoing are optional embodiments of the present disclosure, it should be noted that, for those skilled in the art, any improvement and modification without departing from the principle of the present disclosure are within the protection scope of the present disclosure.

What is claimed is:

1. A display device, comprising a flexible display panel with a bendable region and a flexible support attached to a back side of the flexible display panel, wherein the flexible support comprises a flexible support body, a first part of the flexible support body corresponding to the bendable region is provided with a concave structure, and a second part corresponding to an unbendable region of the flexible display panel, wherein a sum of an area of the first part and an area of the second part is larger than an area of the flexible display panel.

2. The display device according to claim 1, wherein a depth of the concave structure is less than a thickness of the flexible support body.

3. The display device according to claim 2, wherein the concave structure comprises a strip groove, and a length extension direction of the strip groove is parallel to a bending axis of the bendable region.

4. The display device according to claim 3, wherein an opening area of the strip groove is larger than a bottom area of the strip groove.

5. The display device according to claim 4, wherein a cross section of the strip groove perpendicular to the length extension direction is V-shape, trapezoidal or U-shape.

6. The display device according to claim 3, wherein the strip groove is at least partially filled with a buffer material.

7. The display device according to claim 1, wherein a depth of the concave structure is equal to a thickness of the flexible support body.

8. The display device according to claim 7, wherein the concave structure comprises a strip groove, a length extension direction of the strip groove is perpendicular to a bending axis of the bendable region.

9. The display device according to claim 7, wherein the concave structure comprises a through hole penetrating the flexible support body in a thickness direction.

10. The display device according to claim 9, wherein a cross section of the through hole along a direction perpendicular to the thickness direction is rectangular, rhombic or hexagonal.

11. The display device according to claim 1, wherein the flexible support body is a metal film layer.

12. The display device according to claim 1, wherein the flexible support body further comprises an adhesive layer, the flexible support body is attached to the flexible display panel through the adhesive layer.

13. The display device according to claim 12, wherein the adhesive layer is a pressure sensitive adhesive layer.

14. The display device according to claim 1, wherein a thickness of the flexible support ranges from 15 um to 500 um.

15. The display device according to claim 14, wherein the thickness of the flexible support ranges from 50 um to 250 um.

16. The display device according to claim 14, wherein the thickness of the flexible support body ranges from 15 um to 150 um.

17. The display device according to claim 16, wherein the thickness of the flexible support body ranges from 30 um to 50 um.

18. The display device according to claim 1, wherein the display device is a foldable display device.

* * * * *